United States Patent [19]

Kosinski

[11] Patent Number: 4,725,754

[45] Date of Patent: Feb. 16, 1988

[54] METHOD OF MAKING A LOW AGING PIEZOELECTRIC RESONATOR

[75] Inventor: John A. Kosinski, Wall, N.J.

[73] Assignee: The United States of America as represented by the Secretary of the Army, Washington, D.C.

[21] Appl. No.: 72,383

[22] Filed: Jun. 22, 1987

[51] Int. Cl.[4] ............................................. H01L 41/08
[52] U.S. Cl. .................................... 310/357; 310/311; 310/361; 310/312; 29/25.35; 361/233; 204/164
[58] Field of Search ............... 310/311, 312, 357–359, 310/360, 361, 800, 341–344; 29/25.35; 427/100; 361/233; 264/22, 24; 324/56; 204/164

[56] References Cited

U.S. PATENT DOCUMENTS

| | | | |
|---|---|---|---|
| 2,083,420 | 6/1937 | Atchisson | 310/311 X |
| 2,440,886 | 5/1948 | Bach | 310/311 X |
| 3,113,224 | 12/1963 | King | 310/361 |
| 3,288,695 | 11/1966 | King | 310/361 X |
| 3,336,487 | 8/1967 | Martyn et al. | 310/361 X |
| 3,337,439 | 8/1967 | Fraser | 310/361 X |
| 3,932,777 | 1/1976 | King | 310/311 |
| 4,088,917 | 5/1978 | Martin et al. | 310/357 |
| 4,311,938 | 1/1982 | Ballato et al. | 310/311 |
| 4,403,382 | 9/1983 | Facoetti et al. | 310/357 X |
| 4,684,337 | 8/1987 | Bauer | 310/357 X |

*Primary Examiner*—Mark O. Budd
*Attorney, Agent, or Firm*—Sheldon Kanars; Jeremiah G. Murray; Roy E. Gordon

[57] ABSTRACT

A low aging piezoelectric resonator is made from a plate of piezoelectric material using standard resonator fabrication techniques with identical electrodes applied to both major faces of the plate; the electroded plate mounted in a suitable enclosure and the unit vacuum baked and sealed under high vacuum to remove as much contamination as possible, and a DC voltage impressed between the resonator electrodes and the enclosure to create a static electric filed within the enclosure.

8 Claims, No Drawings

METHOD OF MAKING A LOW AGING PIEZOELECTRIC RESONATOR

The invention described herein may be manufactured, used, and licensed by or for the Government for governmental purposes without the payment to me of any royalty thereon.

This invention relates in general to a method of stabilizing the residual environment within a resonator enclosure, and in particular, to a method of making a low aging piezoelectric resonator.

BACKGROUND OF THE INVENTION

Piezoelectric resonators are commonly used in the frequency control circuitry of electronic devices. Their low cost, size, weight, and power consumption when used with appropriate excitation circuitry, make them the devices of choice for many applications, particularly for mobile systems. One of their limitations is, however, the long time frequency drift known as resonator aging. In applications where ultra-low aging is required, high cost, high power atomic standards must be employed. The use of atomic standards also imposes weight and reliability limitations. As a result, reduction of the aging rate of piezoelectric resonators represents a significant need for the frequency control community.

It is commonly believed that one of the major causes of aging in piezoelectric resonators is mass transfer due to residual contamination remaining in the resonator enclosure at the completion of fabrication. Past attempts at reducing the aging caused this contamination have generally involved improved clean procedures and sealing tecnniques. However, there is always some small amount of residual contamination within the enclosure no matter how good the cleaning process. A means of stabilizing the residual contamination is therefore desired as a means of reducing the resonator aging.

It is also well known that the frequency of a piezoelectric resonator is sensitive to the mass loading on its major surface. Contamination adsorbing or desorbing from these major surfaces will contribute to undesired frequency shifts. From kinetic theory, the average residence time of a molecule on a surface is given by $$\tau = \tau_0 e^{-\frac{E_d}{RT}},$$

where T is the temperature, R is the gas constant, and $\tau$ is approximately $10^{-13}$ seconds, and $E_d$ is the desporption energy of the contaminating species. In the past, workers have taken advantage of the temperature dependence of the residence time to remove contamination by high temperature vacuum baking prior to sealing, and it is commonly believed that nothing can be done to influence the residual contamination in the sealed enclosure.

SUMMARY OF THE INVENTION

The general object of this invention is to provide a method of stabilizing the residual environment within a resonator enclosure. A more particular object of the invention is to provide a method of making a low aging piezoelectric resonator.

It has now been found that the aforementioned objects can be attained by making the resonator from a plate of piezoelectric material using standard resonator fabrication techniques with identical electrodes applied to both major faces of the piezoelectric plate, mounting the electroded plate in a suitable enclosure and vacuum baking the unit and sealing under high vacuum to remove as much contamination as possible, and then impressing a DC voltage between the resonator electrodes and the enclosure to create a static electric field within the enclosure. That is, the desorption energy may be varied by the presence of an electric field. While the resonator is in operation at constant temperature, a means now exists to influence the residence time of molecules on the surface and thus influence the mass transfer within the sealed enclosure.

In the method of the invention, the plate can be made of any piezoelectric material as for example lithium niobate, lithium tantalate, quartz, etc. of which quartz is preferred.

Standard precision resonator fabrication techniques are used in making the resonator. Such techniques include high-vacuum processing, high-temperature baking, hermetic sealing, etc.

The enclosure for the resonator is an electrically conducting package or an electrically insulating package having electrically conducting electrodes on the inside of the package.

The DC voltage is applied between the electrodes on the resonator and the electrically conducting surface of the package. The DC voltage applied to both electrodes on the resonator must be the same, giving a zero DC field in the resonator to avoid unwanted sweeping.

The magnitude and polarity of the DC voltage may be adjusted to influence the aging rate of the resonator by:

(A) creating a drift space in the enclosure, and (B) increasing the desorption energies of contaminants in the enclosure.

DESCRIPTION OF THE PREFERRED EMBODIMENT

Typical satellite frequency standards have aging requirements on the order of $10^{-13}$ per day. In order to achieve such low aging rates in typical 5 MHz quartz resonators, mass transfer due to contamination must be on the order of $10^{-7}$ mono-layer per day. According to this invention, such a low aging quartz resonator is made in the following manner.

A resonator is made using standard resonator manufacturing techniques in which identical gold electrodes are applied to both major faces of a piezoelectric quartz plate. The plate is mounted in an enclosure and the unit vacuum baked and sealed under high vacuum to remove as much contamination as is possible. The enclosure is either metallic or has conducting electrodes on its surfaces which are adjacent to the resonator electrodes.

In addition to the RF circuitry used to excite the quartz plate in its role as a frequency determining element, a DC voltage is impressed between the resonator electrodes and the metallic enclosure to create a static electric field within the enclosure.

This static electric field has two effects; to wit, (1) Contamination transfer is reduced due to the fact that the electric field polarizes the contaminating molecules thereby increasing their binding energies. For example, using kinetic theory, one can calculate that for aging rates of $10^{-12}$/day, molecules with desorption energies of 51 kcal/mole predominate. Applying a DC field of sufficient magnitude to increase the desorption energy by only 3 percent will reduce the aging rate caused by this contaminating species to $10^{-}$/day.

(2) A charged drift space is created within the enclosure. The net transfer of the residual molecules in the drift space may be directed as desired to reduce the aging by varying the magnitude and polarity of the applied voltage. For example, an applied uniform DC field will change the particle density of charged species along the direction of the field from a uniform density to a density that is given by the formula $$\eta = \eta_o e^{-q\frac{Er}{RT}}$$

where R is the gas content, T is the absolute temperature, q is the net charge, E is the applied field and r is the distance along the direction of the field. If the field is non-uniform, particles with no net charge will also be redistributed as a result of the force given by $F = p \cdot \nabla E$, where F is the force on the particle, p is the particle dipole moment and $\nabla E$ is the gradient of the non-uniform field. A non-uniform field is obtained by making the electrodes on the resonator of sufficiently different dimension from the electrodes on the package.

In the method of the invention, the same DC voltage level is applied to both resonator electrodes in order to obtain zero static electric field in the resonator. This avoids any unwanted electroelastic or mobile impurities effects, such as polarization effects and sweeping.

As a result of carrying out the method of the invention, all ionic or polarized molecules will be driven to a surface and locked to it, resulting in the stable system desired.

Alternate embodiments are seen as coming within the scope of the invention. For example, one might use ceramic packages with metallized interior surfaces and such devices could also employ surface waves or shallow-bulk waves in addition to bulk waves.

I wish it to be understood that I do not desire to be limited to the exact details as described for obvious modifications will occur to a person skilled in the art.

What is claimed is:

1. Method of making a low aging piezoelectric resonator from a plate of piezoelectric material said method including the steps of:
   (A) making the resonator using standard fabrication techniques with identical electrodes applied to both major faces of the piezoelectric plate,
   (B) mounting the electroded plate in a suitable enclosure and vacuum baking the unit and sealing under high vacuum to remove as much contamination as possible, and
   (C) impressing a DC voltage between the resonator electrodes and the enclosure to create a static electric field within the enclosure.

2. Method according to claim 1 wherein the piezoelectric plate is a quartz plate.

3. Method according to claim 2 wherein identical electrodes of gold are applied to both major faces of the quartz plate.

4. Method according to claim 1 wherein the enclosure is an electrically conductive package.

5. Method according to claim 1 wherein the enclosure is an electrically insulating package having electrically conductive electrodes on the inside of the package.

6. Method according to claim 1 wherein the DC voltage impressed on each of the resonator electrodes is the same giving a zero DC field in the resonator to avoid unwanted sweeping.

7. Method according to claim 1 wherein the magnitude and polarity of the DC voltage impressed may be adjusted to influence the aging rate.

8. Method according to claim 1 wherein the electrodes on the crystal and the electrodes on the package are made of sufficiently different dimension to create a non-uniform electric field.

* * * * *